United States Patent
Gao et al.

(10) Patent No.: US 6,498,707 B1
(45) Date of Patent: Dec. 24, 2002

(54) GIANT MAGNETORESISTIVE SENSOR WITH A CRMNPT PINNING LAYER AND A NIFECR SEED LAYER

(75) Inventors: Zheng Gao, Bloomington, MN (US); Song S. Xue, Eden Prairie, MN (US); Sining Mao, Savage, MN (US)

(73) Assignee: Seagate Technology, LLC, Scotts Valley, CA (US)

(*) Notice: Subject to any disclaimer, the term of this patent is extended or adjusted under 35 U.S.C. 154(b) by 0 days.

(21) Appl. No.: 09/367,952

(22) PCT Filed: Aug. 25, 1999

(86) PCT No.: PCT/US99/19278
§ 371 (c)(1),
(2), (4) Date: Aug. 25, 1999

(87) PCT Pub. No.: WO00/63714
PCT Pub. Date: Oct. 26, 2000

Related U.S. Application Data

(60) Provisional application No. 60/130,204, filed on Apr. 20, 1999.

(51) Int. Cl.[7] .................................................. G11B 5/39
(52) U.S. Cl. .............................. 360/324.11; 360/324.12
(58) Field of Search ................ 360/324.11, 324.12, 360/324.1; 338/32 R; 324/252

(56) References Cited

U.S. PATENT DOCUMENTS

| | | | |
|---|---|---|---|
| 5,731,936 A | 3/1998 | Lee et al. | 360/113 |
| 5,793,279 A | 8/1998 | Nepela | 338/32 |
| 5,843,589 A | * 12/1998 | Hoshiya et al. | 324/252 |
| 5,898,549 A | * 4/1999 | Gill | 360/324.11 |
| 6,046,892 A | * 4/2000 | Aoshima et al. | 360/324.11 |
| 6,141,191 A | * 10/2000 | Lee et al. | 360/324.1 |
| 6,157,525 A | * 12/2000 | Iwasaki et al. | 360/324.12 |
| 6,175,477 B1 | * 1/2001 | Lin et al. | 360/324.12 |
| 6,222,707 B1 | * 4/2001 | Huai et al. | 360/324.1 |
| 6,278,592 B1 | * 8/2001 | Xue et al. | 360/324.11 |
| 6,292,336 B1 | * 9/2001 | Horng et al. | 360/324.12 |

FOREIGN PATENT DOCUMENTS

| | | | | |
|---|---|---|---|---|
| EP | 00883196 a2 | * | 12/1998 | H01L/43/10 |
| JP | 10308004 A | * | 11/1998 | G11B/5/39 |
| JP | 11086229 A | * | 3/1999 | G11B/5/39 |
| JP | 11086235 A | * | 3/1999 | G11B/5/02 |
| JP | 11329838 A | * | 11/1999 | G11B/5/39 |
| JP | 2001202606 A | * | 7/2001 | G01R/33/09 |
| WO | WO 00065578 a1 | * | 11/2000 | G11B/5/39 |

OTHER PUBLICATIONS

Wang et al.: "Spin Dependent Tunnel/Spin–Valve Devices With Different Pinning Structures Made By Photolithography", Journal of Applied Physics, U.S., American Institute of Physics, New York, vol. 85, No. 8, Part 02A, Apr. 15, 1999, pp. 5255–5257, Abstract.

(List continued on next page.)

*Primary Examiner*—William Klimowicz
(74) *Attorney, Agent, or Firm*—Kinney & Lange, P.A.

(57) ABSTRACT

A giant magnetoresistive stack (10) for use in a magnetic read head includes a NiFeCr seed layer (12), a ferromagnetic free layer (14), a nonmagnetic spacer layer (16), a ferromagnetic pinned layer (18), and a CrMnPt pinning layer (20). The ferromagnetic free layer (14) has a rotatable magnetic moment and is positioned adjacent to the NiFeCr seed layer (12). The ferromagnetic pinned layer (18) has a fixed magnetic moment and is positioned adjacent to the CrMnPt pinning layer (20). The nonmagnetic spacer layer (16) is positioned between the free layer (14) and the pinned layer (18). The combination of layers with their respective atomic percentage compositions and thicknesses results in a GMR ratio of at least 12%.

9 Claims, 3 Drawing Sheets

OTHER PUBLICATIONS

Mizuguchi et al.: "Characteristics Of Nife/Cuni Multilayer GMR Sensors For Vertical GMR Heads", IEEE Transactions on Magnetics, US, IEEE Inc., New York, vol. 34, No. 4, Part 01, Jul. 1998, pp. 1504–1506, abstract.

Soeya et al.: "Exchange Coupling Between Ferromagnetic FCC NI81FE19 And Antiferromagnetic BCC CrMnPt Films" Journal of Applied Physics, US, American Institute of Physics, New York, vol. 80, No. 2, Jul. 15, 1996, pp. 1006–1011.

Nishioka et al: "Thickness Effect on Ferro/Antiferromagnetic Coupling of Co/CrMnPt Systems", Journal of Applied Physics, Mar. 15, 1998, AIP, USA, vol. 83, No. 6, pp. 3233–3238.

* cited by examiner

GIANT MAGNETORESISTIVE SENSOR WITH A CRMNPT PINNING LAYER AND A NIFECR SEED LAYER

CROSS-REFERENCE TO RELATED APPLICATION

This application claims priority from Provisional Application No. 60/130,204, filed Apr. 20, 1999 for "Structures to Enhance the GMR Responses and Improve Magnetic Stability Using CrMnPt and NiFeCr Layers" by Zheng Gao, Song S. Xue, and Sining Mao.

BACKGROUND OF THE INVENTION

The present invention relates generally to a giant magnetoresistive sensor for use in a magnetic read head. In particular, the present invention relates to a giant magnetoresistive read sensor having enhanced giant magnetoresistive responses and improved magnetic stability.

Giant magnetoresistive (GMR) read sensors are used in magnetic data storage systems to detect magnetically-encoded information stored on a magnetic data storage medium such as a magnetic disc. A time-dependent magnetic field from a magnetic medium directly modulates the resistivity of the GMR read sensor. A change in resistance of the GMR read sensor can be detected by passing a sense current through the GMR read sensor and measuring the voltage across the GMR read sensor. The resulting signal can be used to recover the encoded information from the magnetic medium.

A typical GMR read sensor configuration is the GMR spin valve, in which the GMR read sensor is a multi-layered structure formed of a nonmagnetic spacer layer positioned between a ferromagnetic pinned layer and a ferromagnetic free layer. The magnetization of the pinned layer is fixed in a predetermined direction, typically normal to an air bearing surface of the GMR read sensor, while the magnetization of the free layer rotates freely in response to an external magnetic field. The resistance of the GMR read sensor varies as a function of an angle formed between the magnetization direction of the free layer and the magnetization direction of the pinned layer. This multi-layered spin valve configuration allows for a more pronounced magnetoresistive effect, i.e. greater sensitivity and higher total change in resistance, than is possible with anisotropic magnetoresistive (AMR) read sensors, which generally consist of a single ferromagnetic layer.

A pinning layer is typically exchange coupled to the pinned layer to fix the magnetization of the pinned layer in a predetermined direction. The pinning layer is typically formed of an antiferromagnetic material. In antiferromagnetic materials, the magnetic moments of adjacent atoms point in opposite directions and, thus, there is no net magnetic moment in the material. It is desirable for the pinning layer material to have a high blocking temperature, the temperature at which the exchange coupling disappears. It is also desirable for the pinning layer material to have a low annealing temperature, the temperature at which the pinning and pinned layers are exchange coupled during manufacturing, to control magnetic behavior and prevent diffusion between thin layers in the GMR spin valve.

A seed layer is typically used to promote the texture and enhance the grain growth of the free layer consequently grown on top of it. The seed layer material is chosen such that its atomic structure, or arrangement, corresponds with the preferred crystallographic direction of the magnetization of the free layer material.

One principal concern in the performance of GMR read sensors is the maximum absolute change in resistance of the GMR read sensor, which directly affects the GMR ratio. GMR ratio (the maximum absolute change in resistance of the GMR read sensor divided by the resistance of the GMR read sensor multiplied by 100%) determines the magnetoresistive effect of the GMR read sensor. Ultimately, a higher GMR ratio yields a GMR read sensor with a greater magnetoresistive effect which is capable of detecting information from a magnetic medium with a higher linear density of data.

Key determinants of the GMR ratio are the materials used as the pinning layer and as the seed layer in the GMR read sensor. A pinning layer material with a low annealing temperature makes it possible to use a thinner free layer which decreases the resistance of the GMR read sensor which in turn increases the GMR ratio. Also, a seed layer material that causes specular scattering and spin filter effect at the seed layer and free layer interface increases the change in resistance of the GMR read sensor which increases the GMR ratio.

Accordingly, there is a need for a GMR read sensor with a higher GMR ratio and for an antiferromagnetic material with a high blocking temperature and a low annealing temperature for use as a pinning layer.

BRIEF SUMMARY OF THE INVENTION

The present invention is a giant magnetoresistive stack for use in a magnetic read head. The giant magnetoresistive stack includes a NiFeCr seed layer, a ferromagnetic free layer, a nonmagnetic spacer layer, a ferromagnetic pinned layer, and a CrMnPt pinning layer. The free layer has a rotatable magnetic moment and is positioned adjacent to the NiFeCr seed layer. The pinned layer has a fixed magnetic moment and is positioned adjacent to the CrMnPt pinning layer. The spacer layer is positioned between the free layer and the pinned layer. In a first preferred embodiment, the free layer is a NiFe/CoFe bilayer, the spacer layer is formed of copper, and the pinned layer is formed of CoFe. In a second preferred embodiment, the free layer is a NiFe/CoFe bilayer, the spacer layer is formed of copper, and the pinned layer is a CoFe/Ru/CoFe synthetic antiferromagnet.

DETAILED DESCRIPTION OF THE PREFERRED EMBODIMENTS

Figure 1:
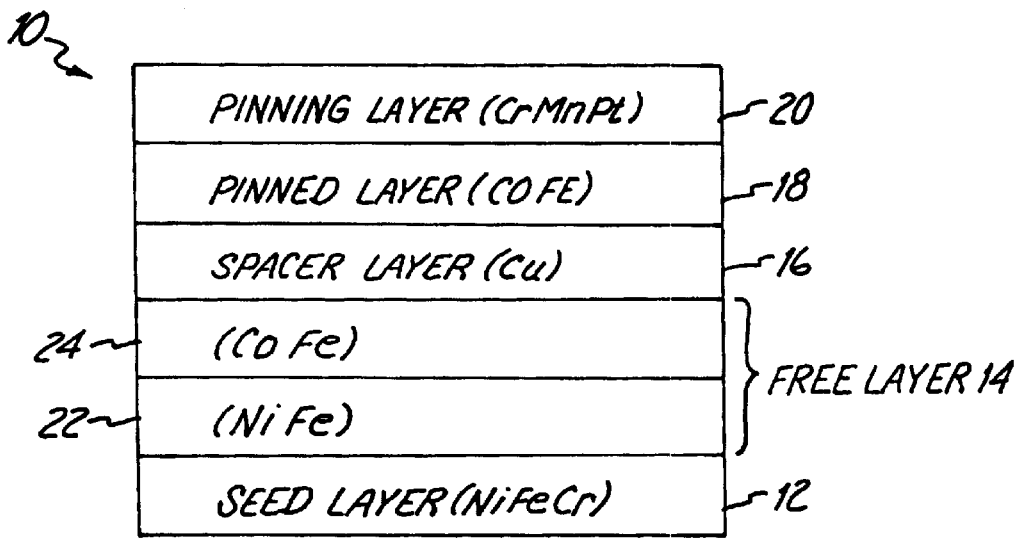
FIG. 1 is a layer diagram of a first embodiment of a giant magnetoresistive stack of the present invention.

FIG. 1 is a layer diagram of a first embodiment of a giant magnetoresistive (GMR) stack 10 of the present invention. GMR stack 10 includes a seed layer 12, a free layer 14, a spacer layer 16, a pinned layer 18, and a pinning layer 20. Seed layer 12 is NiFeCr. Free layer 14 includes a first ferromagnetic material 22, preferably NiFe, and a second ferromagnetic material 24, preferably CoFe, and is positioned such that the first ferromagnetic layer 22 is adjacent to seed layer 12. Pinned layer 18 is a ferromagnetic material, preferably CoFe, and is positioned adjacent to pinning layer 20. Pinning layer 20 is CrMnPt. Spacer layer 16 is a nonmagnetic material, preferably copper, and is positioned between free layer 14 and pinned layer 18.

The magnetization of pinned layer 18 is fixed in a predetermined direction while the magnetization of free layer 14 rotates freely in response to an external magnetic field emanating from a magnetic medium. The magnetization of pinned layer 18 is pinned by exchange coupling pinning layer 20 with pinned layer 18. Pinning layer 20 has a blocking temperature of about 340° C. and an annealing temperature of about 230° C. The atomic structure of seed layer 12 is face-centered cubic (fcc) which promotes the [111] crystallographic texture and enhances the grain growth of free layer 14. The resistance of GMR stack 10 varies as a function of an angle that is formed between the magnetization of free layer 14 and the magnetization of pinned layer 18.

The composition of seed layer 12 is preferably in the range of about Ni(60)Fe(15)Cr(25) to about Ni(48)Fe(12)Cr(40), and more preferably approximately Ni(48)Fe(12)Cr(40), where the numbers in parentheses represent atomic percentage. The thickness of seed layer 12 is preferably in the range of about 20 Å to about 60 Å, and more preferably in the range of about 45 Å to about 50 Å.

The composition of the first ferromagnetic layer 22 of free layer 14 is preferably in the range of about Ni(85)Fe(15) to about Ni(80.5)Fe(19.5), and more preferably approximately Ni(82)Fe(18). The thickness of the first ferromagnetic layer 22 of free layer 14 is preferably in the range of about 20 Å to about 100 Å, and more preferably approximately 30 Å. The composition of the second ferromagnetic layer 24 of free layer 14 is preferably approximately Co(90)Fe(10). The thickness of the second ferromagnetic layer 24 of free layer 14 is preferably in the range of about 5 Å to about 25 Å, and more preferably approximately 13 Å.

The thickness of spacer layer 16 is preferably in the range of about 20 Å to about 35 Å, and more preferably approximately 24 Å.

The composition of pinned layer 18 is preferably approximately Co(90)Fe(10). The thickness of pinned layer 18 is preferably in the range of about 20 Å to about 30 Å, and more preferably approximately 25 Å.

The composition of pinning layer 20 is preferably in the range of about Cr(30)Mn(67)Pt(3) to about Cr(50)Mn(35)Pt(15), and more preferably approximately Cr(43)Mn(50)Pt(7). The thickness of pinning layer 20 is preferably approximately 250 Å.

Figure 2:
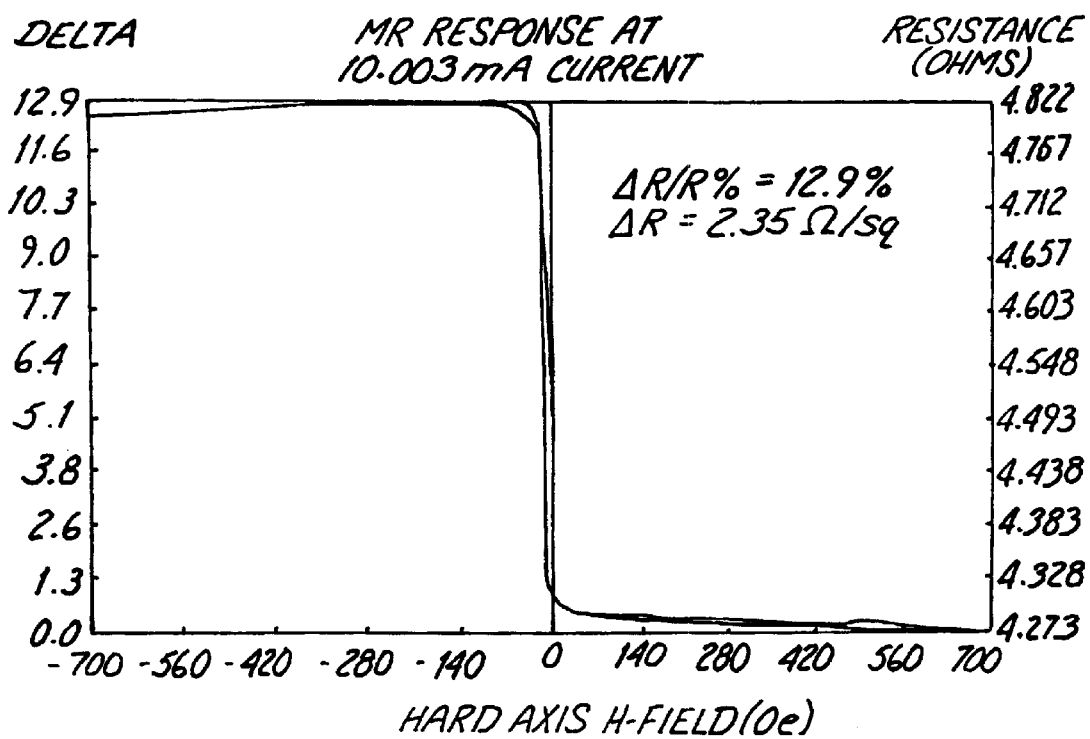
FIG. 2 is a graph of the GMR response of the first embodiment of a giant magnetoresistive stack of the present invention.

FIG. 2 is a graph of the GMR response of GMR stack 10 of the present invention. The graph shows both the GMR ratio and the resistance (Ω) of GMR stack 10 as a function of an applied magnetic field (Oe). The GMR ratio of GMR stack 10 equals 12.9%. The maximum absolute change in sheet resistance of GMR stack 10 equals 2.35 Ω/sq.

Figure 3:
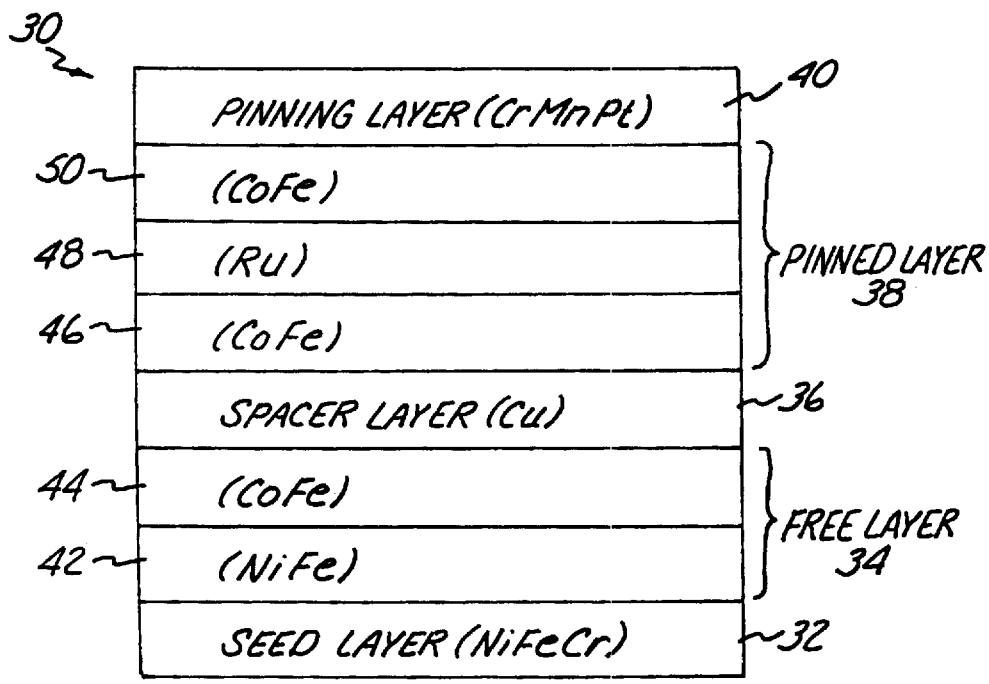
FIG. 3 is a layer diagram of a second embodiment of a giant magnetoresistive stack of the present invention.

FIG. 3 is a layer diagram of a second embodiment of a GMR stack 30 of the present invention. GMR stack 30 includes a seed layer 32, a free layer 34, a spacer layer 36, a pinned layer 38, and a pinning layer 40. Seed layer 32 is NiFeCr. Free layer 34 includes a first ferromagnetic layer 42, preferably NiFe, and a second ferromagnetic layer 44, preferably CoFe, and is positioned such that the first ferromagnetic layer 42 is adjacent to seed layer 32. Pinned layer 38 is a synthetic antiferromagnet and includes first and second ferromagnetic layers 46 and 50, both preferably CoFe, and a coupling layer 48, preferably ruthenium, positioned between first and second ferromagnetic layers 46 and 50, and is positioned such that the second ferromagnetic layer 50 is adjacent to pinning layer 40. Pinning layer 40 is CrMnPt. Spacer layer 36 is a nonmagnetic material, preferably copper, and is positioned between free layer 34 and pinned layer 38.

The magnetization of pinned layer 38 is fixed in a predetermined direction while the magnetization of free layer 34 rotates freely in response to an external magnetic field emanating from a magnetic medium. The magnetization of pinned layer 38 is pinned by exchange coupling pinned layer 38 with pinning layer 40. Pinning layer 40 has a blocking temperature of about 340° C. and an annealing temperature of about 230° C. The atomic structure of seed layer 32 is face-centered cubic (fcc) which promotes the [111] crystallographic texture and enhances the grain growth of free layer 34. The resistance of GMR stack 30 varies as a function of an angle that is formed between the magnetization of free layer 34 and the magnetization of pinned layer 38.

The composition of seed layer 32 is preferably in the range of about Ni(60)Fe(15)Cr(25) to about Ni(48)Fe(12)Cr(40), and more preferably approximately Ni(48)Fe(12)Cr(40). The thickness of seed layer 32 is preferably in the range of about 20 Å to about 60 Å, and more preferably in the range of about 45 Å to about 50 Å.

The composition of the first ferromagnetic layer 42 of free layer 34 is preferably in the range of about Ni(85)Fe(15) to about Ni(80.5)Fe(19.5), and more preferably approximately Ni(82)Fe(18). The thickness of the first ferromagnetic layer 42 of free layer 34 is preferably in the range of about 20 Å to about 100 Å, and more preferably approximately 30 Å. The composition of the second ferromagnetic layer 44 of free layer 34 is preferably approximately Co(90)Fe(10). The thickness of the second ferromagnetic layer 44 of free layer 34 is preferably in the range of about 5 Å to about 25 Å, and more preferably approximately 13 Å.

The thickness of spacer layer 36 is preferably in the range of about 20 Å to about 35 Å, and more preferably approximately 24 Å.

The compositions of the first and second ferromagnetic layers 46 and 50 of pinned layer 38 are both preferably approximately Co(90)Fe(10). The thicknesses of the first and second ferromagnetic layers 46 and 50 of pinned layer 38 are both preferably in the range of about 15 Å to about 40 Å, and more preferably in the range of about 25 Å to about 30 Å. The thickness of coupling layer 48 of pinned layer 38 is preferably in the range of about 8 Å to about 12 Å.

The composition of pinning layer 40 is preferably in the range of about Cr(30)Mn(67)Pt(3) to about Cr(50)Mn(35)Pt(15), and more preferably approximately Cr(43)Mn(50)Pt(7). The thickness of pinning layer 40 is preferably approximately 150 Å.

Figure 4:
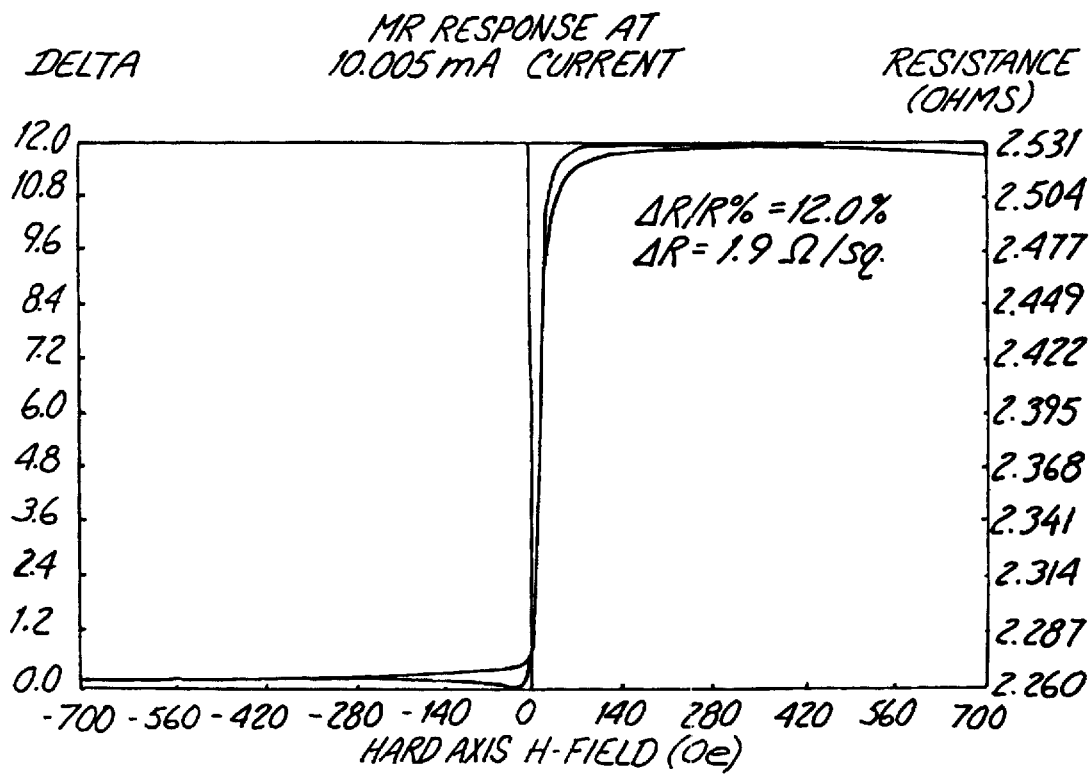
FIG. 4 is a graph of the GMR response of the second embodiment of a giant magnetoresistive stack of the present invention.

FIG. 4 is a graph of the GMR response of GMR stack 30 of the present invention. The graph shows both the GMR ratio and the resistance (Ω) of GMR stack 30 as a function of an applied magnetic field (Oe). The GMR ratio of GMR stack 30 equals 12.0%. The maximum absolute change in sheet resistance of GMR stack 30 equals 1.9 Ω/sq.

Figure 5:
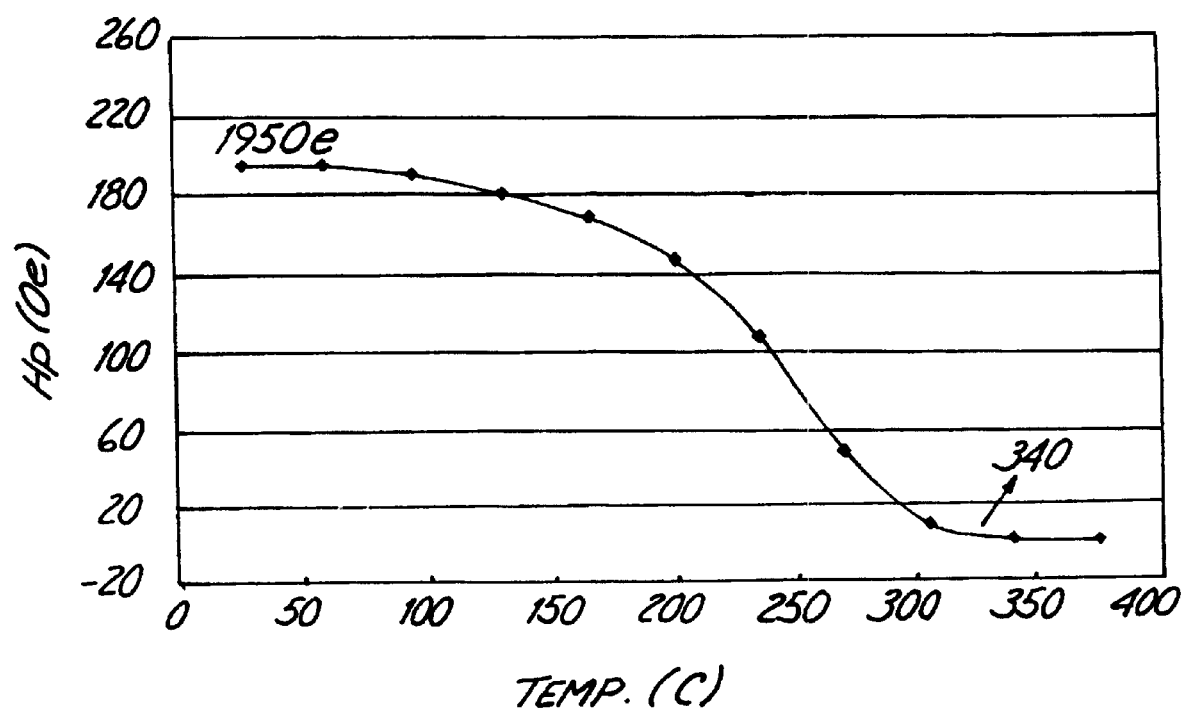
FIG. 5 is a graph of the blocking temperature measurement of a CrMnPt pinning layer.

FIG. 5 is a graph of the blocking temperature measurement of a CrMnPt pinning layer. The graph shows the strength of the exchange coupling (Oe) as a function of temperature (°C). At 340° C., the strength of the exchange coupling becomes 0 Oe.

In summary, the present invention introduces a GMR read sensor with a CrMnPt pinning layer and a NiFeCr seed layer. This configuration exhibits a GMR ratio of at least 12%, the highest ever reported in simple top spin valves. In addition, the CrMnPt pinning layer has a high blocking temperature of about 340° C. to prevent the exchange coupling from disappearing. Also, the CrMnPt pinning layer has a low annealing temperature of about 230° C. to control magnetic behavior and prevent diffusion between thin layers in the GMR read sensor during manufacturing.

Although the present invention has been described with reference to preferred embodiments, workers skilled in the art will recognize that changes may be made in form and detail without departing from the spirit and scope of the invention.

What is claimed is:

1. A giant magnetoresistive spin valve for use in a magnetic read head, the giant magnetoresistive spin valve exhibiting a GMR ratio of at least 12% and comprising:

a NiFeCr seed layer having a thickness in a range of about 45 Å to about 50 Å, and a Cr atomic percentage of between about 25 and about 40;

a ferromagnetic free layer having a rotatable magnetic moment positioned adjacent to the seed layer;

a ferromagnetic pinned layer having a fixed magnetic moment;

a CrMnPt pinning layer having a thickness of about 150 Å to about 250 Å, and a Pt atomic percentage of between about 3 and about 15, wherein the pinning layer is positioned adjacent to the pinned layer; and a nonmagnetic spacer layer positioned between the free layer and the pinned layer.

2. The giant magnetoresistive stack of claim 1 wherein the pinned layer is CoFe.

3. The giant magnetoresistive stack of claim 1 wherein the pinned layer is a synthetic antiferromagnet.

4. The giant magnetoresistive stack of claim 3 wherein the synthetic antiferromagnet comprises:

a first CoFe layer positioned adjacent to the spacer layer;

a second CoFe layer positioned adjacent to the pinning layer; and a ruthenium layer positioned between the first and second CoFe layers.

5. The giant magnetoresistive stack of claim 4 wherein:

the first and second CoFe layers have thicknesses in a range of about 15 Å to about 40 Å; and the ruthenium layer has a thickness in a range of about 8 Å to about 12 Å.

6. The giant magnetoresistive stack of claim 1 wherein the free layer is a bilayer.

7. The giant magnetoresistive stack of claim 6 wherein the bilayer comprises:

a NiFe layer positioned adjacent to the seed layer; and a CoFe layer positioned adjacent to the spacer layer.

8. The giant magnetoresistive stack of claim 7 wherein:

the NiFe layer has a thickness in a range of about 20 Å to about 100 Å; and the CoFe layer has a thickness in a range of about 5 Å to about 25 Å.

9. The giant magnetoresistive stack of claim 1 wherein the pinned layer has a thickness in a range of about 20 Å to about 30 Å.

* * * * *